(12) United States Patent
Hsu et al.

(10) Patent No.: US 11,145,747 B2
(45) Date of Patent: Oct. 12, 2021

(54) FINFET STRUCTURE

(71) Applicant: Taiwan Semiconductor Manufacturing Co., Ltd., Hsinchu (TW)

(72) Inventors: Hsin-Yun Hsu, Taoyuan (TW); Hsiao-Kuan Wei, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/901,992

(22) Filed: Feb. 22, 2018

(65) Prior Publication Data
US 2019/0123175 A1 Apr. 25, 2019

Related U.S. Application Data

(60) Provisional application No. 62/576,762, filed on Oct. 25, 2017.

(51) Int. Cl.
*H01L 29/66* (2006.01)
*H01L 21/321* (2006.01)
(Continued)

(52) U.S. Cl.
CPC .. *H01L 29/66795* (2013.01); *H01L 21/28088* (2013.01); *H01L 21/28105* (2013.01);
(Continued)

(58) Field of Classification Search
CPC ......... H01L 29/66795; H01L 21/28088; H01L 29/42372; H01L 29/4966; H01L 29/785;
(Continued)

(56) References Cited

U.S. PATENT DOCUMENTS 7,029,966 B2 *  4/2006  Amos ............... H01L 21/76895
                                              257/E21.59
8,884,370 B2 * 11/2014  Chang .................... H01L 29/785
                                              257/347
(Continued)

OTHER PUBLICATIONS

Reyes-Betanzo et al. ("Study of Conditions for Anisotropic Plasma Etching of Tungsten and Tungsten Nitride Using SF6/Ar Gas Mixtures" Journal of The Electrochemical Society, 149 (3) G179-G183 (2002)).*

*Primary Examiner* — Wael M Fahmy
*Assistant Examiner* — Sue Tang
(74) *Attorney, Agent, or Firm* — McClure, Qualey & Rodack, LLP

(57) ABSTRACT

A semiconductor device structure is provided. The semiconductor device structure includes a substrate having a fin structure protruding therefrom, an insulating layer is over the substrate to cover the fin structure, a gate structure in the insulating layer and over the fin structure, and source and drain features covered by the insulating layer and over the fin structure on opposing sidewall surfaces of the gate structure. The gate structure includes a gate electrode layer, a conductive sealing layer covering the gate electrode layer, and a gate dielectric layer between the fin structure and the gate electrode layer and surrounding the gate electrode layer and the conductive sealing layer. The gate electrode layer has a material removal rate that is higher than the material removal rate of the conductive sealing layer in a chemical mechanical polishing process.

20 Claims, 8 Drawing Sheets

(51) Int. Cl.
    *H01L 21/28*     (2006.01)
    *H01L 29/78*     (2006.01)
    *H01L 29/49*     (2006.01)
    *H01L 29/423*     (2006.01)

(52) U.S. Cl.
    CPC .... *H01L 21/3212* (2013.01); *H01L 29/42372* (2013.01); *H01L 29/4966* (2013.01); *H01L 29/6656* (2013.01); *H01L 29/66545* (2013.01); *H01L 29/785* (2013.01); *H01L 29/7851* (2013.01)

(58) Field of Classification Search
    CPC ........... H01L 21/3212; H01L 29/66545; H01L 29/6656; H01L 21/28105
    See application file for complete search history.

(56) References Cited

U.S. PATENT DOCUMENTS

| | | | |
|---|---|---|---|
| 9,209,273 B1 * | 12/2015 | Lin | H01L 29/4966 |
| 2013/0260549 A1 * | 10/2013 | Jagannathan | H01L 21/28518 |
| | | | 438/592 |
| 2014/0295659 A1 * | 10/2014 | Lim | H01L 29/4966 |
| | | | 438/591 |
| 2015/0021672 A1 * | 1/2015 | Chuang | H01L 21/28088 |
| | | | 257/288 |

* cited by examiner

FINFET STRUCTURE

CROSS REFERENCE TO RELATED APPLICATIONS

This application claims the benefit of U.S. Provisional Application No. 62/576,762 filed on Oct. 25, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over three sides (e.g., wrapping) the fin. Advantages of the FinFET may include reducing the short channel effect and increasing the current flow.

Although existing FinFETs and methods of fabricating FinFETs have been generally adequate for their intended purposes, they have not been entirely satisfactory in all respects. For example, as the size of FinFET device structure has been reduced, problems may occur when gate structure with small critical dimension (CD) are formed. Therefore, it is a challenge to form reliable gate structures at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
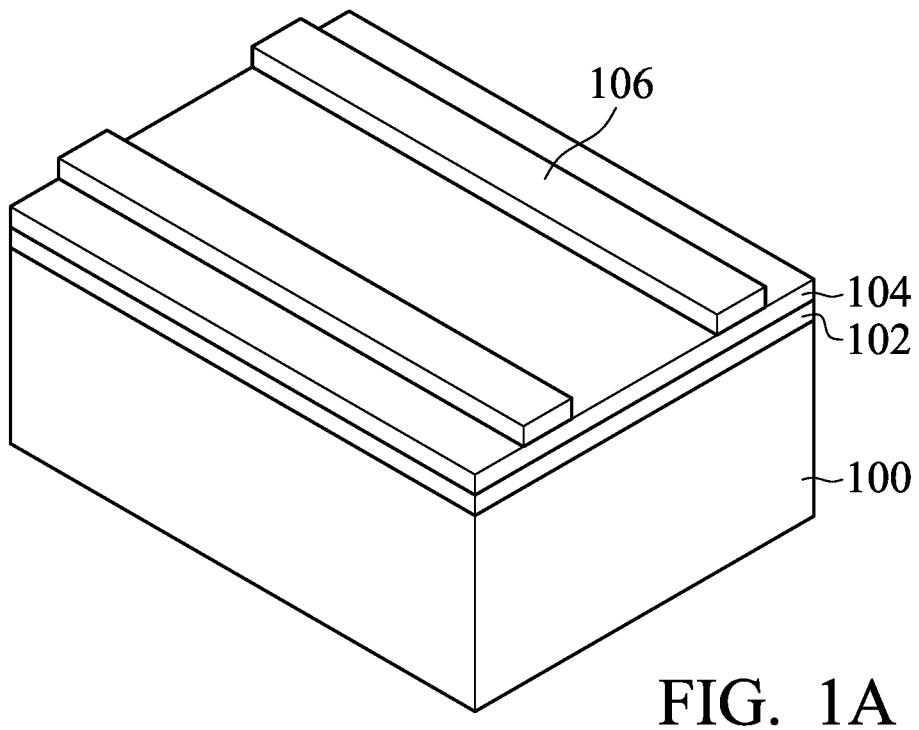
FIGS. 1A to 1J show perspective representations of various stages of forming a FinFET structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments of a fin field effect transistor (FinFET) structure and a method for forming a FinFET structure are provided. FIGS. 1A to 1J show perspective representations of various stages of forming a FinFET structure, in accordance with some embodiments of the disclosure.

As shown in FIG. 1A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. In some embodiments, the substrate 100 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

Afterwards, an insulating layer 102 and a masking layer 104 may be successively formed over the substrate 100, in accordance with some embodiments. In some embodiments, the insulating layer 102 is a buffer layer or an adhesion layer that is formed between the underlying substrate 100 and the overlying masking layer 104. In addition, the insulating layer 102 may be used as an etch stop layer when the masking layer 104 is removed or etched.

In some embodiments, the insulating layer 102 is made of silicon oxide. In some embodiments, the insulating layer 102 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the masking layer 104 is made of silicon oxide, silicon nitride, silicon oxynitride, or another applicable material. In some other embodiments, more than one masking layer 104 is formed over the insulating layer 102. In some embodiments, the masking layer 104 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After formation of the insulating layer 102 and the masking layer 104, a patterned photoresist layer 106 may be formed over the masking layer 104 for definition of one or more fin structures in the substrate 100. In some embodiments, the patterned photoresist layer 106 is formed by a photolithography process. For example, the photolithography process may include photoresist coating (e.g., spin-on coating), soft baking, mask aligning, exposure, post-exposure baking, developing the photoresist, rinsing and drying (e.g., hard baking).

Figure 1B:
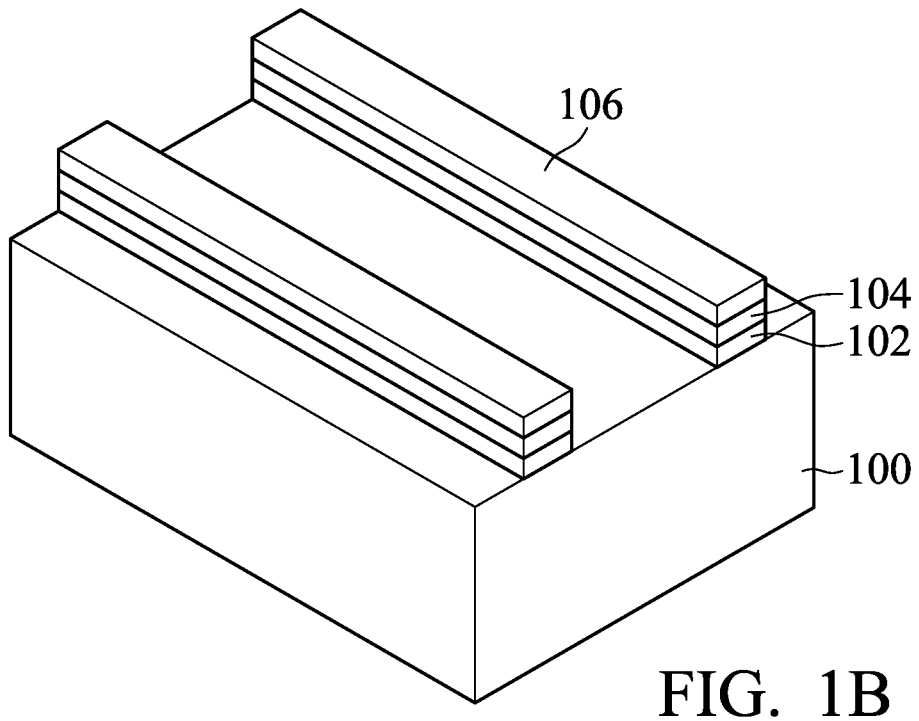

As shown in FIG. 1B, after the patterned photoresist layer 106 is formed, the insulating layer 102 and the overlying masking layer 104 are patterned by using the patterned photoresist layer 106 as an etch mask, in accordance with some embodiments. As a result, a patterned insulating layer 102 and a patterned masking layer 104 are formed, so as to expose portions of the underlying substrate 100.

Figure 1C:
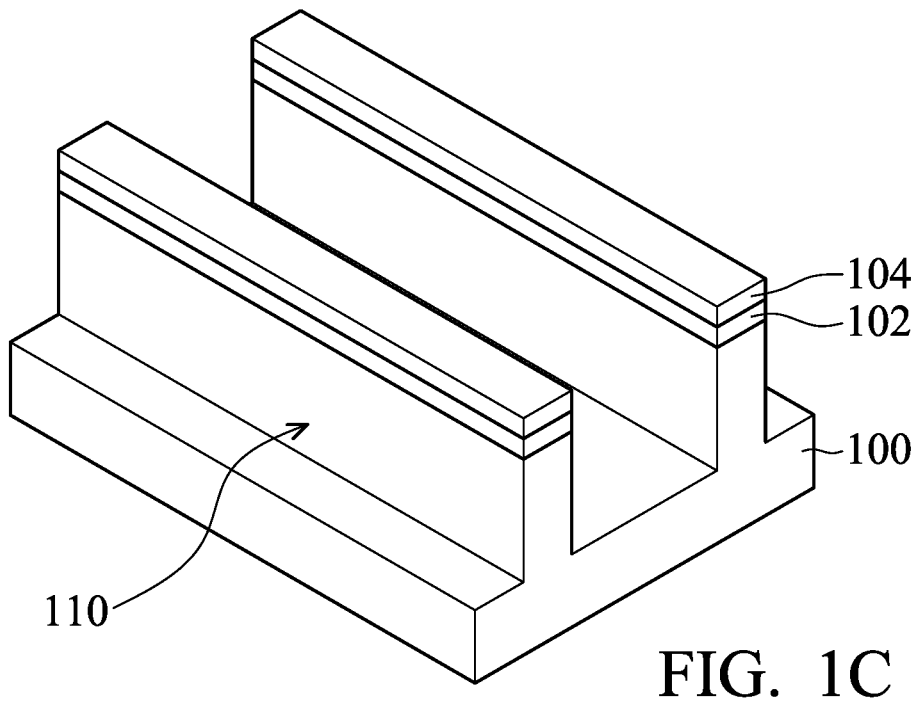

As shown in FIG. 1C, after the portions of the substrate 100 are exposed by forming the patterned insulating layer 102 and the patterned masking layer 104, the patterned photoresist layer 106 is removed, in accordance with some embodiments. Afterwards, an etching process is performed on the substrate 100 to form fin structures and trenches in the substrate 100 by using the patterned insulating layer 102 and the patterned masking layer 104 as an etch mask. In order to simplified the diagram, two fin structures 110 are depicted as an example.

In some embodiments, the etching process for formation of fin structures 110 is a dry etching process or a wet etching process. In an example, the substrate 100 is etched by a dry etching process, such as a reactive ion etching (RIE), neutral beam etching (NBE), the like, or a combination thereof. The dry etching process may be performed using a process gas including fluorine-based etchant gas. For example, the process gas may include $SF_6$, $C_xF_y$, $NF_3$ or a combination thereof. The etching process may be a time-controlled process, and continue until the fin structures 110 are formed and reach a predetermined height. In some other embodiments, each of the fin structures 110 has a width that gradually increases from the top portion to the lower portion. Namely, each of the fin structures 110 may have tapered sidewalls A person of ordinary skill in the art will readily understand other methods of forming the fin structures, which are contemplated within the scope of some embodiments.

Figure 1D:
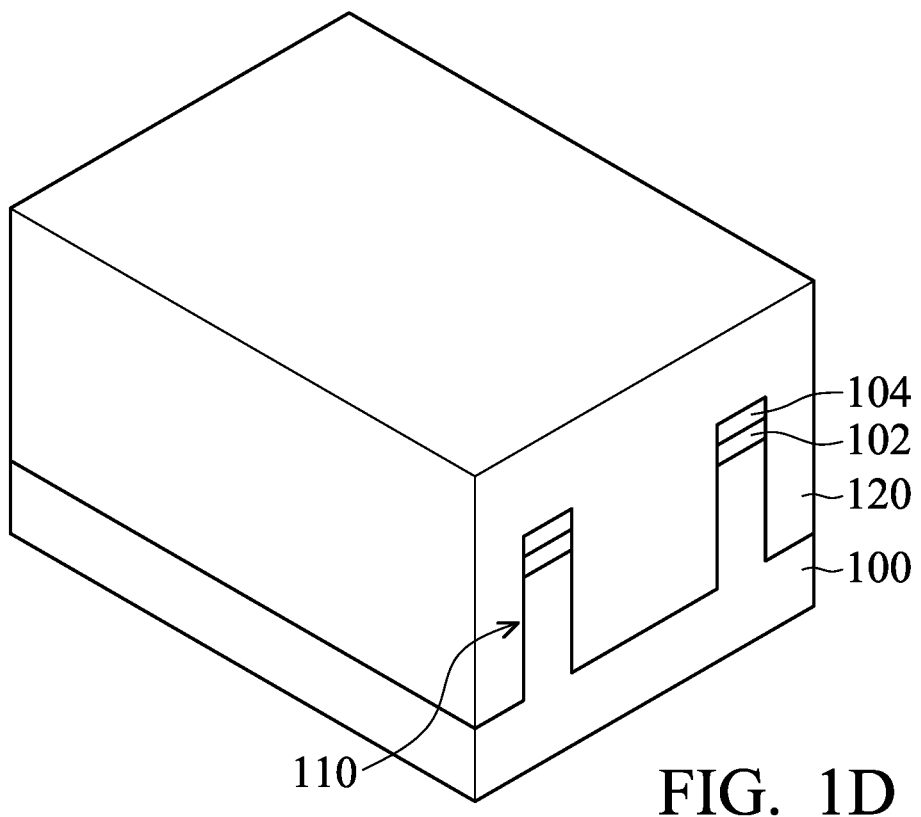

As shown in FIG. 1D, after the fin structures 110 are formed, an insulating layer 120 is formed to cover the fin structures 110 over the substrate 100, in accordance with some embodiments. In some embodiments, the insulating layer 120 is made of silicon oxide, fluoride-doped silicate glass (FSG), a low-k dielectric material, and/or another suitable dielectric material or another low-k dielectric material. The insulating layer 120 may be deposited by a chemical vapor deposition (CVD) process, a spin-on-glass process, or another applicable process.

In some other embodiments, a liner structure (not shown) is formed on the sidewalls of the fin structures 110 and the bottom of the trenches in the substrate 100 prior to formation of the insulating layer 120. In some embodiments, the liner structure may include a single layer or a multiple structure and may be made of silicon oxide, silicon nitride, silicon oxynitride, silicon carbide (SiC), or a combination thereof. The liner structure may be deposited by a chemical vapor deposition (CVD) process or another applicable process.

Afterwards, the insulating layer 120 is thinned or planarized to expose the top surface of the patterned masking layer 104, in accordance with some embodiments. For example, the insulating layer 120 is planarized by a chemical mechanical polishing (CMP) process. After the top surface of the patterned masking layer 104 is exposed, the patterned masking layer 104 and the patterned insulating layer 102 are successively removed by one or more etching processes, so as to expose the top surfaces of the fin structures 110. In some embodiments, the patterned masking layer 104 and the patterned insulating layer 102 are removed by a dry etching process, a wet etching process, or a combination thereof.

Figure 1E:
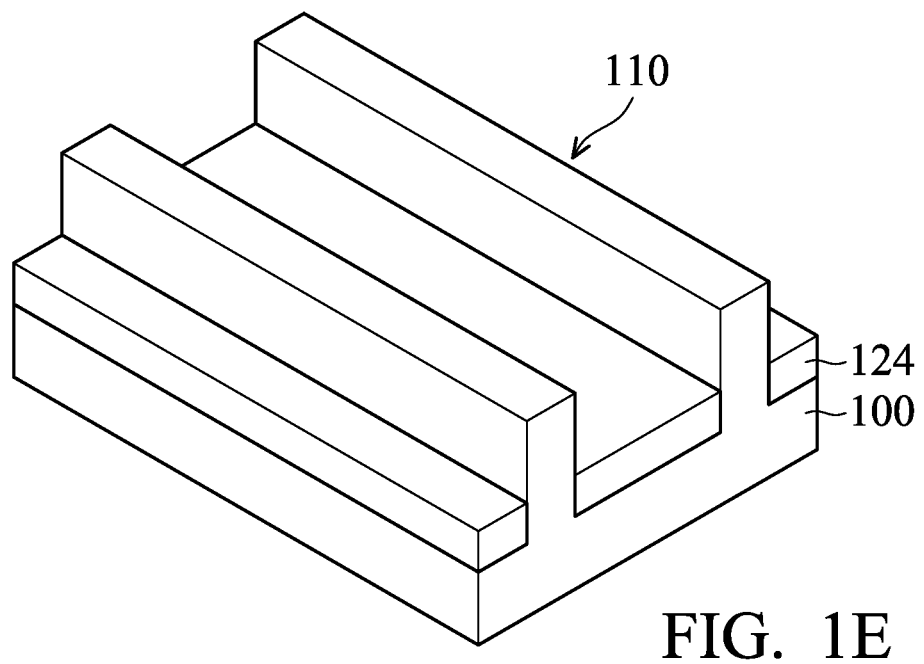

Afterwards, as shown in FIG. 1E, a portion of the insulating layer 120 is removed to form isolation features 124, in accordance with some embodiments. In some embodiments, the isolation feature 124 includes the remaining insulator layer 120 and the liner structure (not shown) surrounding the remaining insulator layer 120. The isolation features 124 may be shallow trench isolation (STI) structures surrounding the fin structures 110. A lower portion of each fin structure 110 is surrounded by the isolation features 124, and an upper portion of each fin structure 110 protrudes from the isolation features 124. In other words, a portion of the fin structure 110 is embedded in the isolation features 124. The isolation features 124 may prevent electrical interference or crosstalk.

Figure 1F:
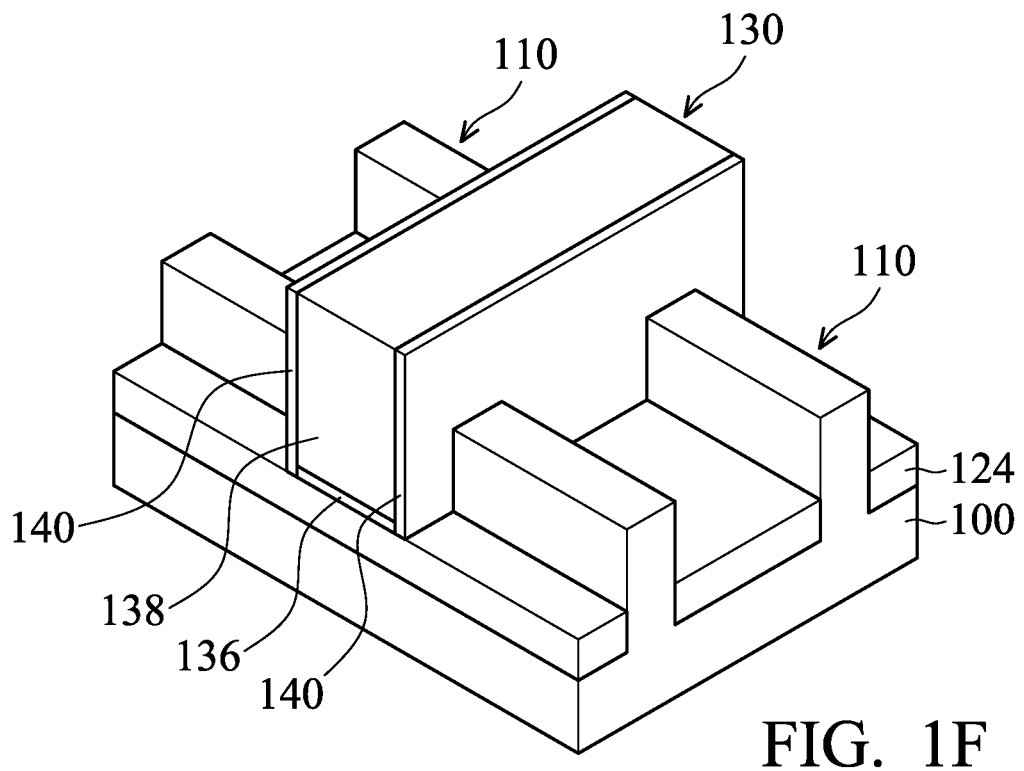

As shown in FIG. 1F, after formation of the isolation features 124, a dummy gate structure 130 is formed across the fin structures 110 and extends over the isolation features 124, in accordance with some embodiments. In some embodiments, the dummy gate structure 130 includes a dummy gate dielectric layer 136 and a dummy gate electrode layer 138 over the dummy gate dielectric layer 136.

The dummy gate dielectric layer 136 is made of high-k dielectric materials, such as metal oxide in accordance with some embodiments. Examples of the high-k dielectric material may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the dummy gate dielectric layer 136 may be formed by chemical vapor deposition (CVD), physical vapor deposition, (PVD), atomic layer deposition (ALD), or other applicable processes.

After the dummy gate dielectric layer 136 is formed, the dummy gate electrode layer 138 is formed over dummy gate dielectric layer 136 in accordance with some embodiments. In some embodiments, the dummy gate electrode layer 138 is made of polysilicon. Afterwards, the dummy gate dielectric layer 136 and the dummy gate electrode layer 138 are patterned to form the dummy gate structure 130, in accordance with some embodiments After the dummy gate structure 130 is formed, gate spacer layers 140 are formed on opposite sidewall surfaces of the dummy gate structure 130. The gate spacer layers 140 may be a single layer or multiple layers. In some embodiments, the gate spacer layers 140 are made of silicon nitride, silicon oxide, silicon carbide, silicon oxynitride, or other applicable materials.

Figure 1G:
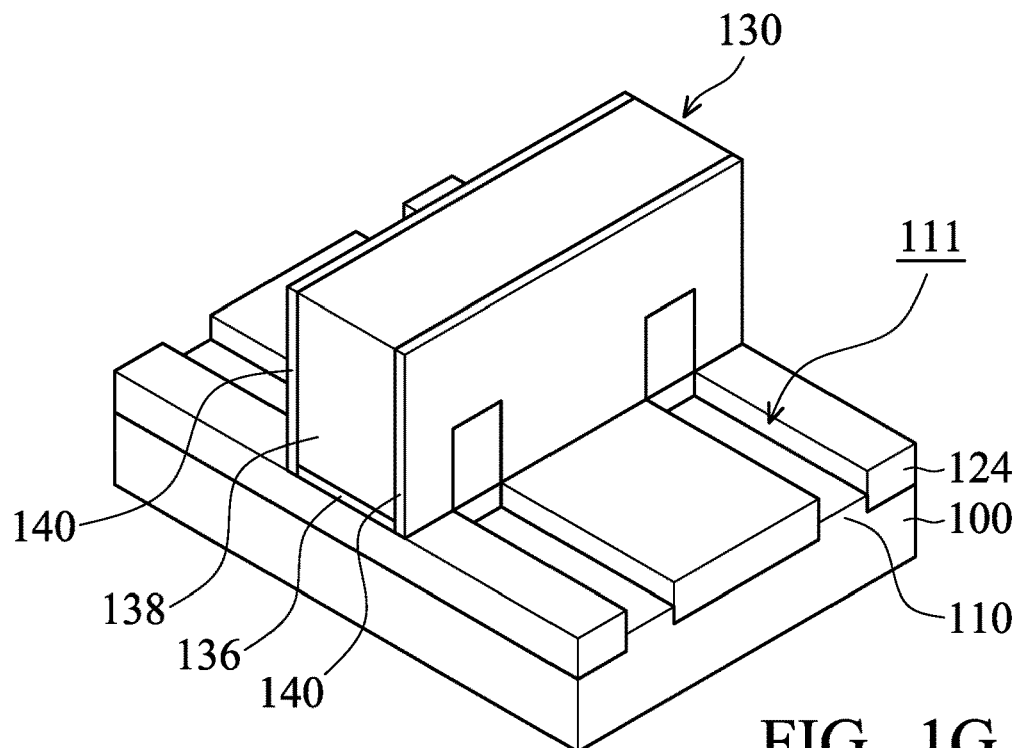

As shown in FIG. 1G, after the gate spacer layers 140 is formed, a recess 111 is formed in each fin structure 110, in accordance with some embodiments. The bottom surface of the recess 111 is lower than a top surface of the isolation feature 124.

Figure 1H:
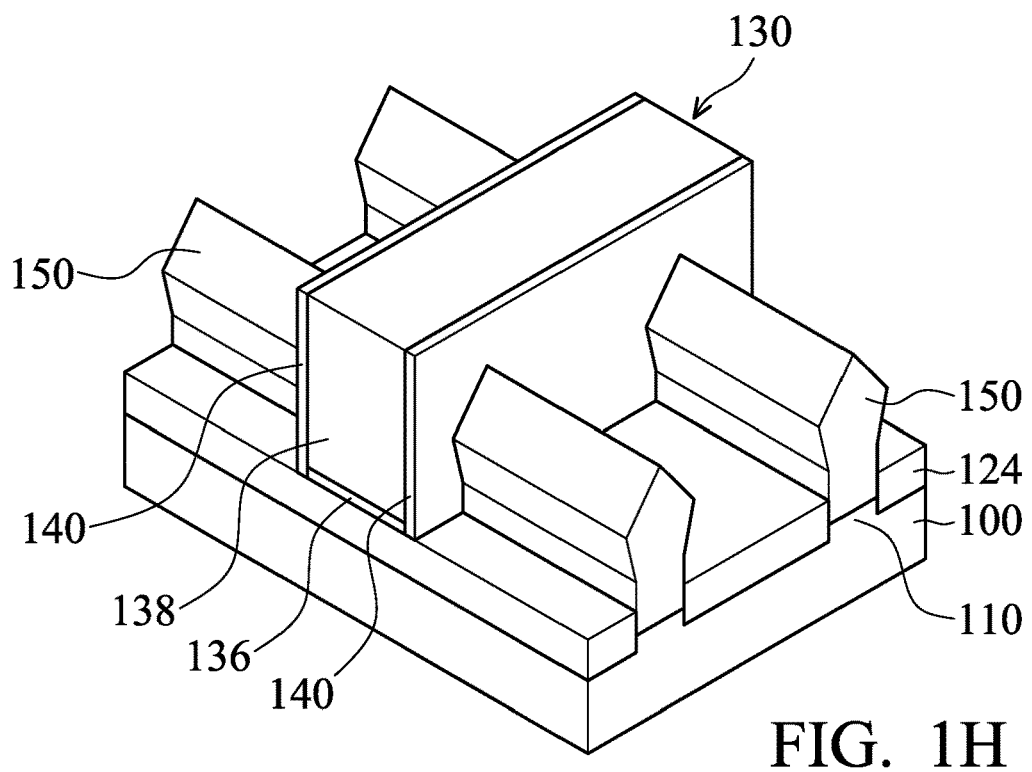

As shown in FIG. 1H, after the recess 111 is formed, a source/drain (S/D) feature 150 is formed in the recess 111 (indicated by FIG. 1G) of each fin structure 110 and protrudes from the recess 111, in accordance with some embodiments. In some embodiments, portions of the fin structure 110 adjacent to the dummy gate structure 130 are recessed to form recesses 111, and a strained material is grown in each recess 111 of the fin structure 110 by an epitaxial process to form the S/D features 150. The S/D features 150 are formed over the fin structure 110.

In some embodiments, the lattice constant of the strained material may be different from the lattice constant of the substrate 100. In some embodiments, the S/D structure 150 includes Ge, SiGe, InAs, InGaAs, InSb, GaAs, GaSb, InAlP, InP, or the like.

Figure 1I:
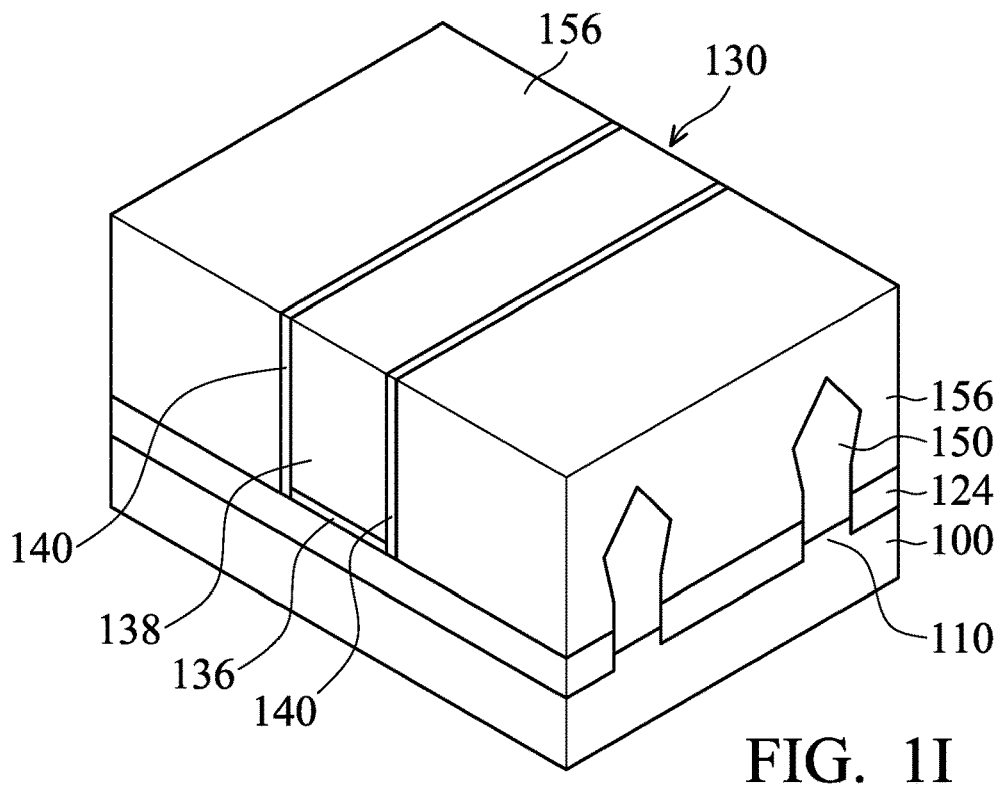

As shown in FIG. 1I, after the S/D feature 150 is formed, a contact etch stop layer (not shown) is formed over the substrate 100, and an insulating layer 156 (e.g., an inter-layer dielectric (ILD) layer) is formed over the contact etch stop layer, in accordance with some embodiments. In some embodiments, the contact etch stop layer is made of silicon nitride, silicon oxynitride, and/or other applicable materials. The contact etch stop layer may be formed by plasma enhanced chemical vapor deposition (PECVD), low-pressure chemical vapor deposition (LPCVD), atomic layer deposition (ALD), or other applicable processes.

In some embodiments, the insulating layer 156 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The insulating layer 156 may be formed by chemical vapor deposition (CVD), physical vapor deposition, (PVD), atomic layer deposition (ALD), spin-on coating, or another applicable process.

Afterwards, a planarization process is performed on the insulating layer 156 until the top surface of the dummy gate structure 130 is exposed. In some embodiments, the insulating layer 156 is planarized by a polishing process, such as a chemical mechanical polishing (CMP) process.

Figure 1J:
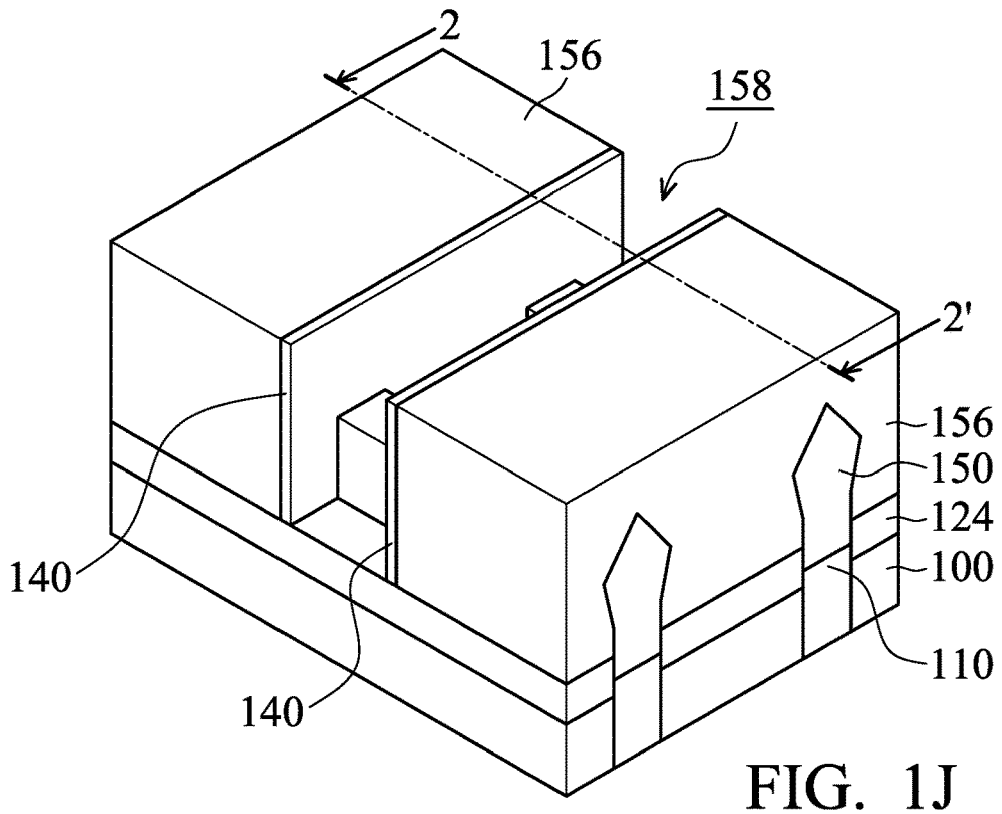

As shown in FIG. 1J, after the insulating layer 156 is planarized and the dummy gate structure 130 is exposed, the dummy gate structure 130 is removed to form an opening 158 in the insulating layer 156, in accordance with some embodiments. The dummy gate dielectric layer 136 and the dummy gate electrode layer 138 are removed by an etching process, such as a dry etching process or a wet etching process.

Figure 2A:
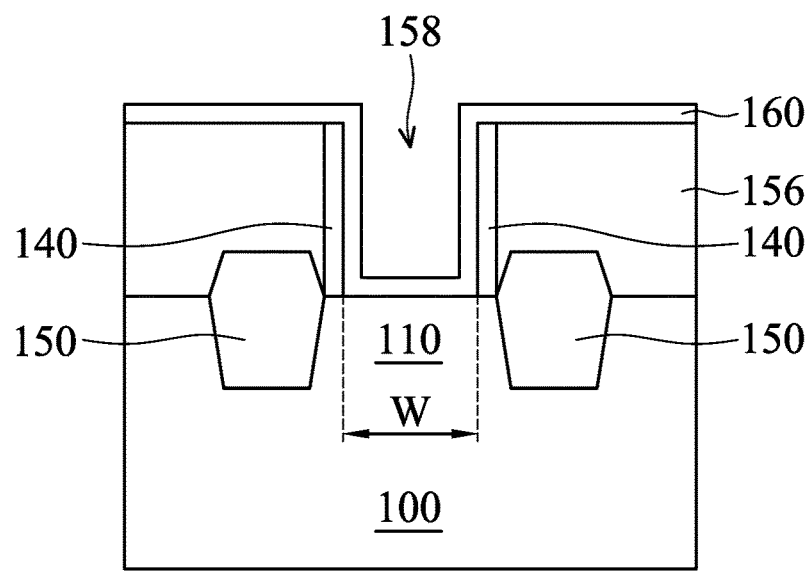
FIGS. 2A to 2F show cross-sectional representations of various stages of forming the FinFET structure after the structure of FIG. 1J, in accordance with some embodiments of the disclosure.

FIGS. 2A to 2D show cross-sectional representations of various stages of forming the FinFET structure after the structure of FIG. 1J, in accordance with some embodiments of the disclosure. FIG. 2A shows a cross-sectional representation taken along line 2-2' of the structure shown in FIG. 1J. As shown in FIG. 2A, the structure shown in FIG. 1J is provided, in accordance with some embodiments. In some embodiments, the structure includes a substrate 100 having a fin structure 110 protruding therefrom. S/D features 150 are formed over the fin structure 110. An insulating layer 156 (e.g., an inter-layer dielectric (ILD) layer) is formed over the substrate 100 to cover the fin structure 110 and the S/D features 150. An opening 158 is formed in the insulating layer 156 by removing the dummy gate structure 130 (as shown in FIG. 1I) to expose the fin structure 110 between the S/D features 150, so that the S/D features 150 are on opposing sidewall surfaces of the opening 158. In some embodiments, the opening 158 has a width W that is in a range of about 20 nm to about 23 nm. Gate spacer layers 140 are formed on opposite sidewall surfaces of the opening 158. Afterwards, a gate structure is formed in opening 158, in accordance with some embodiments. In some embodiments, the gate structure at least includes a gate dielectric layer, a work functional metal layer, and a gate electrode layer.

As shown in FIG. 2A, a gate dielectric layer 160 is conformally formed over the insulating layer 156 and conformally covers the inner surface of the opening 158, in accordance with some embodiments. The gate dielectric layer 160 formed in the opening 158 may cover the gate spacers 140 and the exposed fin structure 110 between the S/D features 150. In some embodiments, the gate dielectric layer 160 is made of a high k dielectric material, such as metal oxide. Examples of the high-k dielectric material may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the gate dielectric layer 160 may be formed by chemical vapor deposition (CVD), physical vapor deposition, (PVD), atomic layer deposition (ALD), or another applicable process.

In some other embodiments, an interfacial layer (not shown) is formed between the exposed fin structure 110 and the gate dielectric layer 160, so that the adhesion of the gate dielectric layer 160 can be improved. In some embodiments, the interfacial layer is made of $SiO_2$. In some embodiments, the interfacial layer is formed by an atomic layer deposition (ALD) process, a thermal oxidation process, chemical vapor deposition (CVD) process, or another applicable process.

Figure 2B:
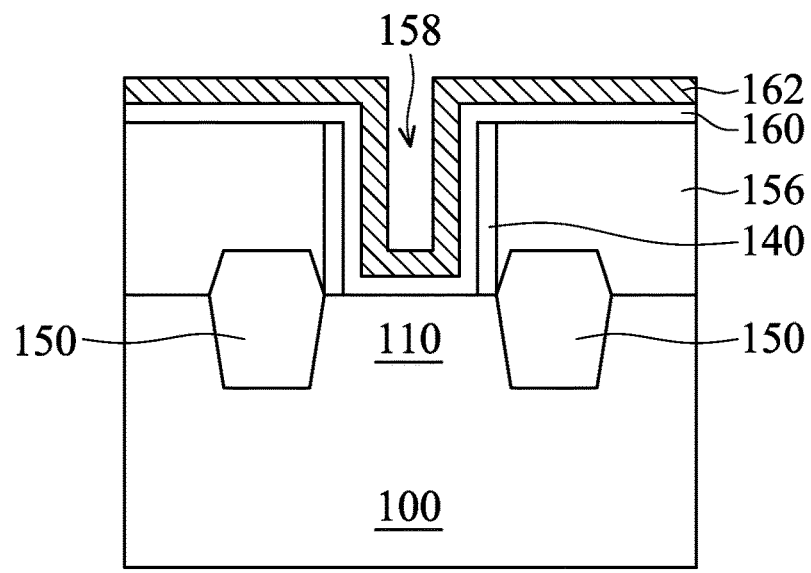

As shown in FIG. 2B, after the gate dielectric layer 160 is formed, a work functional metal layer 162 is conformally formed over the insulating layer 156 and conformally covers the inner surface of the opening 158 that is covered by the gate dielectric layer 160, in accordance with some embodiments. The work function metal layer 162 is tuned to have a proper work function. In some embodiments, the work function metal layer 162 is made of N-type work-function metal or P-type work-function metal. The N-type work-function metal includes titanium (Ti), aluminum (Al), titanium aluminum alloy (TiAl), titanium aluminum nitride (TiAlN), titanium aluminum carbide (TiAlC), tantalum carbide (TaC), tantalum carbon nitride (TaCN), or a combination thereof. The P-work-function metal includes titanium nitride (TiN), tungsten nitride (WN), tantalum nitride (TaN), or a combination thereof. In some embodiments, the work function metal layer 162 is formed by atomic layer deposition (ALD), sputtering, physical vapor deposition (PVD), or another applicable process.

In some other embodiments, a conformal capping or barrier layer (not shown) is formed over the gate dielectric layer 128 prior to formation of the work function metal layer 162, so that the capping or barrier layer is between gate dielectric layer 128 and the work function metal layer 162. The capping or barrier layer is employed to prevent the metal formed over it from penetrating into the channel region of the fin structure 110 below metal gate structure. In some embodiments, the capping or barrier layer is made of metal nitride. Examples of the metal nitride may include TiN, TaN, and WN. The capping or barrier layer may be formed by physical vapor deposition, (PVD), atomic layer deposition (ALD), or another applicable process.

Figure 2C:
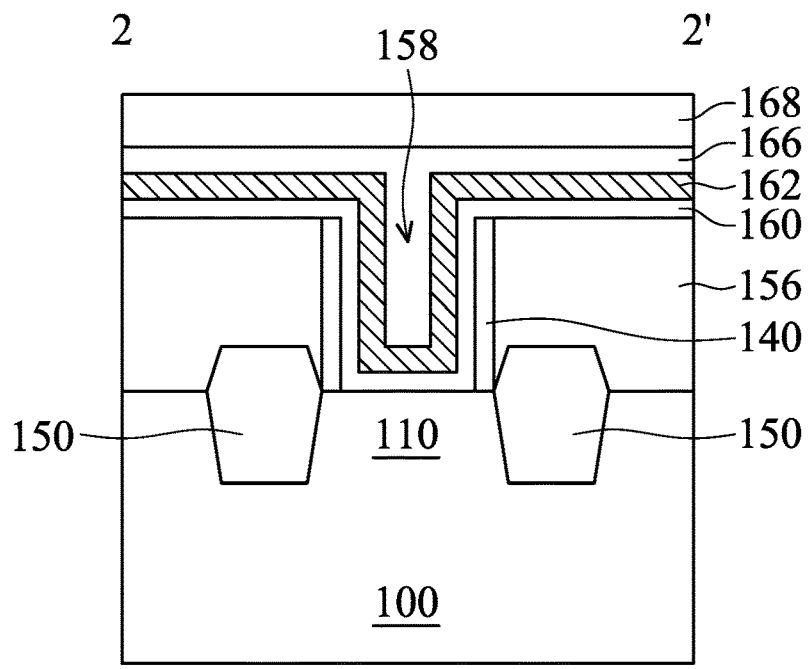

As shown in FIG. 2C, after the work functional metal layer 162 is formed, a metal nucleation layer 166 is formed over the insulating layer 156 and fills the opening 158 to cover the work functional metal layer 162, in accordance with some embodiments. Afterwards, a metal bulk layer 168 is formed over the metal nucleation layer 166. The metal nucleation layer 166 is formed between the work functional metal layer 162 and the subsequent formed metal bulk layer 168, so that the adhesion of the metal bulk layer 168 can be improved. In some embodiments, the opening 158 having the work functional metal layer 162 therein is fully filled by the metal nucleation layer 166, such that the metal bulk layer 168 is formed above the opening 158, as shown in FIG. 2C. However, in some other embodiments, the insulating layer 156 may include some openings (not shown) used for formation gate structures. Those openings may have a width greater than that of the opening 158. In those cases, those openings are not fully filled with the metal nucleation layer 166, such that the metal bulk layer 168 fills those openings to serve as a gate electrode layer. In some embodiments, the metal nucleation layer 166 in the opening 158 serve as a gate electrode layer. In some embodiments, the metal nucleation layer 166 and the overlying metal bulk layer 168 are made of tungsten (W). In some embodiments, the metal nucleation layer 166 may be formed by physical vapor deposition, (PVD), atomic layer deposition (ALD), or another applicable process. In some embodiments, the metal bulk layer 168 is formed by chemical vapor deposition (CVD), high density plasma CVD (HDPCVD), metal organic CVD (MOCVD), plasma enhanced CVD (PECVD), or another applicable process.

In some other embodiments, a conformal blocking layer (not shown) is formed over the work functional metal layer 162 prior to formation of the metal nucleation layer 166, so that the blocking layer is between work functional metal layer 162 and the metal nucleation layer 166. The blocking layer is employed to prevent the byproduct formed during the metal bulk layer 168 deposition from diffusing toward the layers below. In some embodiments, the blocking layer is made of metal nitride. Examples of the metal nitride may include TiN, TaN, and WN. The blocking layer may be formed by physical vapor deposition, (PVD), atomic layer deposition (ALD), or another applicable process.

Figure 2D:
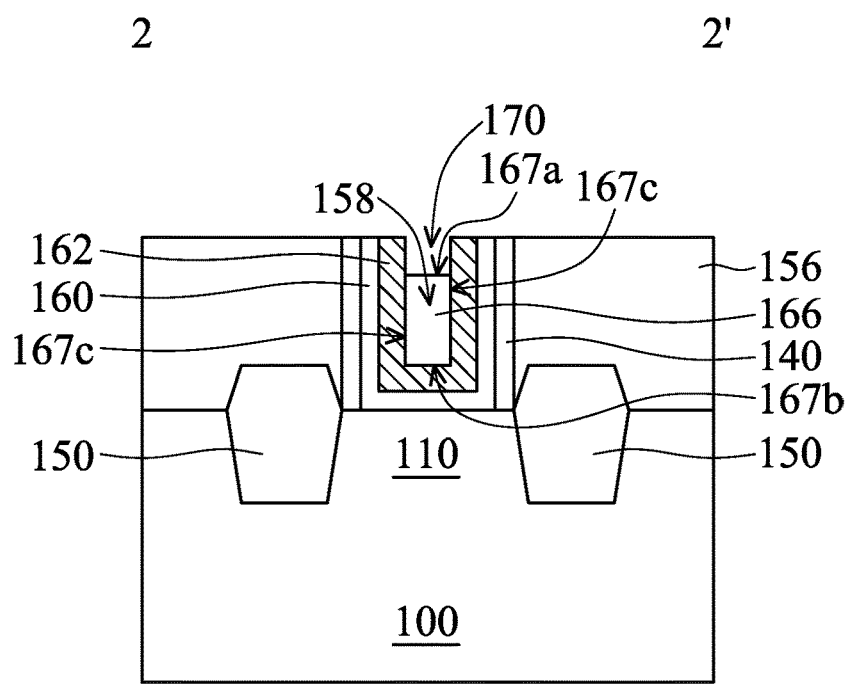

As shown in FIG. 2D, after the metal bulk layer 168 is formed, the metal bulk layer 168, the metal nucleation layer 166, and the work function metal layer 162 over the insulating layer 156 are successively removed, in accordance with some embodiments. For example, the metal bulk layer 168, the metal nucleation layer 166, and the work function metal layer 162 over the insulating layer 156 are successively removed by a chemical mechanical polishing (CMP) process to expose a top surface of the insulating layer 156.

During the CMP process, there is a large oxidation-reduction potential difference between the material of the metal nucleation layer 166 (e.g., tungsten (W)) and the materials (e.g., TiN, TaN, WN, TiN, TaN, WN, TiAl, TiAlN, TiAlC, or TaCN) of the layers below the metal nucleation layer 166 (such as the blocking layer, the work function metal layer 162, and the capping or barrier layer). Therefore, the metal nucleation layer 166 has a material removal rate that is higher than material removal rates of the layers below the metal nucleation layer 166 in the CMP process. In other words, with respect to the slurry used in the CMP process, the metal nucleation layer 166 has a higher etching rate or a lower chemical resistance than those of the layers below the metal nucleation layer 166. As a result, the recess defect may be induced and a recess 170 may be formed above the remaining metal nucleation layer 166 in the opening 158 and surrounded by the remaining work function metal layer 162 and the remaining gate dielectric layer 160 in the opening 158.

After the CMP process is performed, the remaining metal nucleation layer 166 below the recess 170 serve as a gate electrode layer, in accordance with some embodiments. The gate electrode layer has a top surface 167a, a bottom surface 167b, and sidewall surfaces 167c, as shown in FIG. 2D. A portion of the remaining work function metal layer 162 in the opening 158 is below the bottom surface 167b of the gate electrode layer and covers the sidewall surfaces 167c of the gate electrode layer.

Figure 2E:
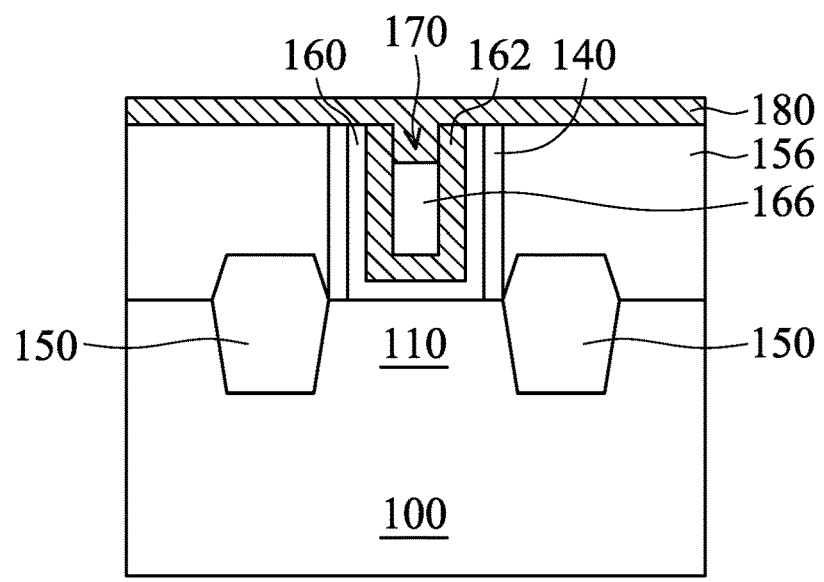

As shown in FIG. 2E, after the recess 170 is formed, a conductive sealing layer 180 is formed over the exposed insulating layer 156 and fills the recess 170, in accordance with some embodiments. In some embodiments, the material the conductive sealing layer 180 is different from that of the gate electrode layer (i.e., the metal nucleation layer 166), so that the gate electrode layer has a material removal rate that is higher than a material removal rate of the conductive sealing layer in the CMP process used for removal of the metal nucleation layer 166 and the layers below the metal nucleation layer 166.

In some embodiments, the conductive sealing layer 180 has a material removal rate that is substantially the same as the material removal rate of the layers below the metal nucleation layer 166 (e.g., the work function metal layer 162) in the CMP process used for removal of the metal nucleation layer 166 and the layers below the metal nucleation layer 166. Examples of the material of the conductive sealing layer 180 may include TiN, TaN, WN, TiN, TaN, WN, TiAl, TiAlN, TiAlC, or TaCN and the conductive sealing layer 180 may be formed by the process for formation of the blocking layer, the work function metal layer 162, or the capping or barrier layer, as described previously.

Alternatively, the conductive sealing layer 180 has a material removal rate that is further lower than the material removal rate of the layers below the metal nucleation layer 166 (e.g., the work function metal layer 162) in the CMP process used for removal of the metal nucleation layer 166 and the layers below the metal nucleation layer 166.

Figure 2F:
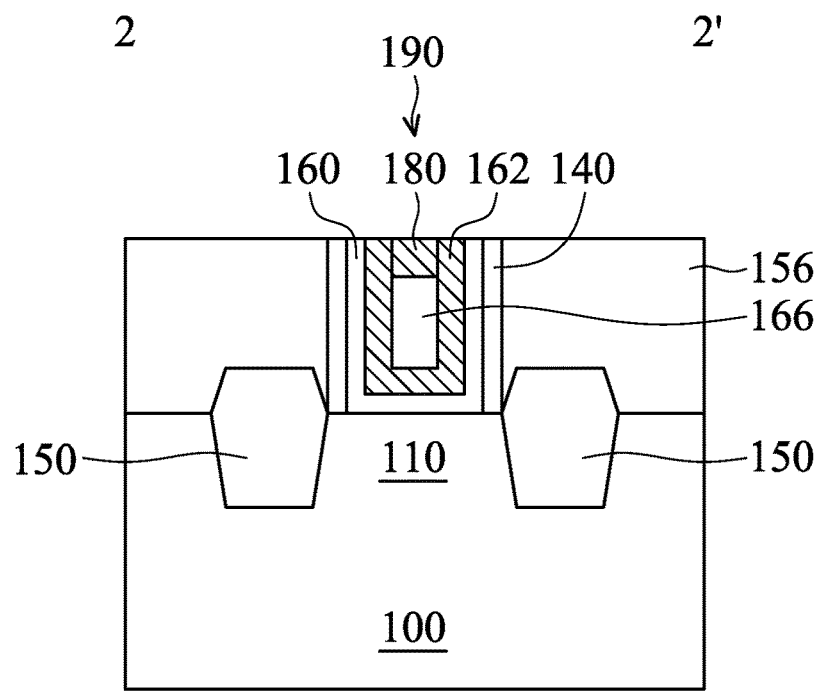

As shown in FIG. 2F, after the conductive sealing layer 180 is formed, the conductive sealing layer 180 over the insulating layer 156 is removed, in accordance with some embodiments. For example, the conductive sealing layer 180 over the insulating layer 156 is removed by a CMP process to expose the top surface of the insulating layer 156. After the CMP process for removal of the conductive sealing layer 180 is performed, a gate structure 190 is formed. In some embodiments, the gate structure 190 may at least include the gate dielectric layer 160, the work function metal layer 162, the gate electrode layer (i.e., the metal nucleation layer 166), and the conductive sealing layer 180 that are formed in the opening 158 (as indicated in FIGS. 2A to 2D).

During the CMP process, there is a small oxidation-reduction potential difference or no oxidation-reduction potential difference between the conductive sealing layer 180 and the materials (e.g., TiN, TaN, WN, TiN, TaN, WN, TiAl, TiAlN, TiAlC, or TaCN) of the layers below the metal nucleation layer 166 (such as the blocking layer, the work function metal layer 162, and the capping or barrier layer). Therefore, the conductive sealing layer 180 has a material removal rate that is lower than or substantially equal to the material removal rates of the layers below the metal nucleation layer 166 in the CMP process used for removal of the conductive sealing layer 180. Also, the conductive sealing layer 180 has a material removal rate that is lower than the material removal rate of the metal nucleation layer 166 in the CMP process used for removal of the metal bulk layer 168 and the metal nucleation layer 166.

As a result, the recess defect may be eliminated or mitigated, so that the remaining conductive sealing layer 180 in the recess 170 may have a top surface substantially level with the top surface of the insulating layer 156.

Embodiments of a semiconductor device structure and a method for forming the same are provided. The semiconductor device structure includes a gate structure that is formed in an insulating layer over a substrate. The formation of the gate structure includes successively forming a work function metal layer and a metal nucleation layer over the insulating layer and fills an opening in the insulating layer; successively removing the metal nucleation layer and the work function metal layer over the insulating layer by a first chemical mechanical polishing process, in which a recess is formed above the metal nucleation layer in the opening; forming a conductive sealing layer over the insulating layer and filling the recess; and removing the conductive sealing layer over the insulating layer by a second chemical mechanical polishing process. In some embodiments, the conductive sealing layer has a material removal rate that is lower than a material removal rate of the metal nucleation layer in a CMP process, such as the first or second CMP process described above.

According to the foregoing embodiments, since the recess formed above the metal nucleation layer is filled by the conductive sealing layer, the conductive sealing layer in the recess can have a top surface substantially level with the top surface of the insulating layer, thereby eliminating or mitigating the recess effect induced by performing a CMP process. As a result, the reliability of the subsequently formed contact structure can be increased, so as to improve the yield of the semiconductor devices.

In some embodiments, a semiconductor device structure is provided. The semiconductor device structure includes a substrate having a fin structure protruding therefrom, an insulating layer is over the substrate to cover the fin structure, a gate structure in the insulating layer and over the fin structure, and source and drain features covered by the insulating layer and over the fin structure on opposing sidewall surfaces of the gate structure. The gate structure includes a gate electrode layer, a conductive sealing layer covering the gate electrode layer, and a gate dielectric layer between the fin structure and the gate electrode layer and surrounding the gate electrode layer and the conductive sealing layer. The gate electrode layer has a material removal rate that is higher than a material removal rate of the conductive sealing layer in a chemical mechanical polishing process.

In some embodiments, a semiconductor device structure is provided. The semiconductor device structure includes an insulating layer over a substrate and a gate structure in the insulating layer. The gate structure includes a gate electrode layer having a top surface, a bottom surface, and sidewall surfaces, a conductive sealing layer covering the top surface of the gate electrode layer, a work function metal layer below the bottom surface of the gate electrode layer and covering the sidewall surfaces of the gate electrode layer, and a gate dielectric layer between the substrate and the work function metal layer and surrounding the gate electrode layer and the conductive sealing layer. The gate electrode layer has a material removal rate that is higher than a material removal rate of the conductive sealing layer and a material removal rate of the work function metal layer in a chemical mechanical polishing process.

In some embodiments, a method for forming a semiconductor device structure is provided. The method includes providing an insulating layer over a substrate that has a fin structure protruding therefrom. The insulating layer includes an opening that exposes the fin structure. A work function metal layer is formed over the insulating layer and conformally covers an inner surface of the opening. A metal nucleation layer is over the work function metal layer and fills the opening. A metal bulk layer is over the metal nucleation layer. The metal bulk layer, the metal nucleation layer, and the work function metal layer over the insulating layer are successively removed by a first chemical mechanical polishing process to expose the insulating layer, in which a recess is formed above the metal nucleation layer in the opening and surrounded by the work function metal layer in the opening. A conductive sealing layer is formed over the insulating layer and fills the recess. The conductive sealing layer over the insulating layer is removed by a second chemical mechanical polishing process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a substrate having a fin structure protruding therefrom;
an insulating layer over the substrate to cover the fin structure;
a gate structure in the insulating layer and over the fin structure, comprising:

a gate electrode layer;
a conductive sealing layer having a substantially flat bottom surface to entirely cover a substantially flat top surface of the gate electrode layer; and
a gate dielectric layer between the fin structure and the gate electrode layer and surrounding the gate electrode layer and the conductive sealing layer, wherein the gate dielectric layer has a top surface that is substantially level with a top surface of the conductive sealing layer;
a work function metal layer over the gate dielectric layer, wherein a portion of the work function metal layer is sandwiched between the conductive sealing layer and the gate dielectric layer; and
source and drain features covered by the insulating layer and over the fin structure on opposing sidewall surfaces of the gate structure.

2. The semiconductor device structure as claimed in claim 1, wherein the gate electrode layer is made of a tungsten nucleation layer.

3. The semiconductor device structure as claimed in claim 1, wherein the conductive sealing layer comprises TiN, TaN, WN, TiAl, TiAlN, TiAlC, or TaCN.

4. The semiconductor device structure as claimed in claim 1, wherein a top surface of the work function metal layer is not level with a top surface of the gate electrode layer.

5. The semiconductor device structure as claimed in claim 1, wherein the conductive sealing layer is made of TiAl, TiAlN, TiAlC, or TaCN.

6. The semiconductor device structure as claimed in claim 1, wherein a conductive sealing layer is in direct contact with the gate electrode layer.

7. The semiconductor device structure as claimed in claim 1, wherein a bottommost surface of the conductive sealing layer is no lower than a topmost surface of the gate electrode layer.

8. The semiconductor device structure as claimed in claim 1, further comprising:
a gate spacer on a sidewall of the gate structure, wherein a top surface of the gate spacer is substantially level with the top surface of the conductive sealing layer.

9. A semiconductor device structure, comprising:
an insulating layer over a substrate; and
a gate structure in the insulating layer, comprising:
a gate electrode layer having a top surface, a bottom surface, and sidewall surfaces;
a conductive sealing layer having a substantially flat bottom surface in direct contact the top surface of the gate electrode layer;
a work function metal layer below the bottom surface of the gate electrode layer and covering the sidewall surfaces of the gate electrode layer, wherein an interface between the conductive sealing layer and the work function metal layer is substantially level with one of the sidewalls surfaces of the gate electrode layer; and
a gate dielectric layer between the substrate and the work function metal layer and surrounding the gate electrode layer and the conductive sealing layer, wherein the gate dielectric layer has a top surface that is substantially level with a top surface of the conductive sealing layer.

10. The semiconductor device structure as claimed in claim 9, wherein the gate electrode layer is made of a tungsten nucleation layer.

11. The semiconductor device structure as claimed in claim 9, wherein the conductive sealing layer is made of a material that is the same as that of the work function metal layer.

12. The semiconductor device structure as claimed in claim 9, wherein the conductive sealing layer comprises TiN, TaN, WN, TiAl, TiAlN, TiAlC, or TaCN.

13. The semiconductor device structure as claimed in claim 9, wherein a top surface of the work function metal layer is higher than the top surface of the gate electrode layer.

14. A semiconductor device structure, comprising:
a substrate;
an insulating layer over the substrate; and
a metal stack over the substrate and in the insulating layer, comprising:
a first metal layer;
a second metal layer directly above and entirely capping a top surface of the first metal layer; and
a third metal layer between the insulating layer and the first metal layer to cover sidewalls surfaces and a bottom surface of the first metal layer and sidewall surfaces of the second metal layer,
wherein a top surface of the third metal layer is higher than an interface between the second metal layer and the first metal layer and is substantially level with a top surface of the second metal layer.

15. The semiconductor device structure as claimed in claim 14, wherein the metal stack and a gate dielectric layer form a gate structure, and wherein the gate dielectric layer is between the insulating layer and the third metal layer and between the substrate and the third metal layer.

16. The semiconductor device structure as claimed in claim 14, wherein the first metal layer is made of a tungsten nucleation layer and the second metal layer comprises TiN, TaN, WN, TiAl, TiAlN, TiAlC, or TaCN.

17. The semiconductor device structure as claimed in claim 14, wherein the first metal layer is made of a tungsten nucleation layer and the third metal layer comprises TiN, TaN, WN, TiAl, TiAlN, TiAlC, or TaCN.

18. The semiconductor device structure as claimed in claim 14, wherein a bottom portion of the second metal layer is no lower than a top portion of the first metal layer.

19. The semiconductor device structure as claimed in claim 14, further comprising:
a gate spacer on a sidewall of the metal stack, wherein a top surface of the gate spacer is substantially level with the top surface of the second metal layer.

20. The semiconductor device structure as claimed in claim 19, further comprising:
a gate dielectric layer around the third metal layer, wherein a top surface of the gate dielectric layer is substantially level with the top surface of the second metal layer.

* * * * *